United States Patent [19]

Suzuki et al.

[11] Patent Number: 4,529,897
[45] Date of Patent: Jul. 16, 1985

[54] ANALOG SWITCH DEVICE HAVING THRESHOLD CHANGE REDUCING MEANS

[75] Inventors: Yasoji Suzuki, Yokosuka; Kenji Matsuo; Akira Yamaguchi, both of Yokohama, all of Japan

[73] Assignee: Tokyo Shibaura Denki Kabushiki Kaisha, Kawasaki, Japan

[21] Appl. No.: 398,356

[22] Filed: Jul. 15, 1982

[30] Foreign Application Priority Data

| Jul. 17, 1981 | [JP] | Japan | 56-111931 |
| Jul. 17, 1981 | [JP] | Japan | 56-111932 |
| Jul. 17, 1981 | [JP] | Japan | 56-111933 |
| Jul. 17, 1981 | [JP] | Japan | 56-111935 |
| Mar. 31, 1982 | [JP] | Japan | 57-53482 |

[51] Int. Cl.³ .................. H03K 17/687; H03K 3/01
[52] U.S. Cl. .................. 307/571; 307/573; 307/583; 307/296 R
[58] Field of Search .......... 307/571, 573–579, 307/583, 585, 296 R

[56] References Cited

U.S. PATENT DOCUMENTS

| 3,457,435 | 7/1969 | Burns et al. | 307/585 |
| 3,866,064 | 2/1975 | Gregory et al. | 307/585 |
| 4,001,606 | 1/1977 | Dingwall. | |

FOREIGN PATENT DOCUMENTS 2231933  1/1973  Fed. Rep. of Germany ...... 307/251

OTHER PUBLICATIONS

CMOS Quad Analog Switch, Solid State Scientific, Inc., Nov. 1976, p. 168.

Primary Examiner—Stanley D. Miller
Assistant Examiner—B. P. Davis
Attorney, Agent, or Firm—Finnegan, Henderson, Farabow, Garrett & Dunner

[57] ABSTRACT

An analog switch device has p- and n-channel metal oxide semiconductor field effect transistors, each having a source electrode, a drain electrode, a gate electrode and a substrate electrode. The p- and n-channel metal oxide semiconductor field effect transistors are connected parallel to each other. First and second analog signals are received and produced at a pair of nodes between the p- and n-channel metal oxide semiconductor field effect transistors. Control signals which are inverted with each other are respectively supplied to the gate electrodes of the p- and n-channel metal oxide semiconductor field effect transistors. A voltage buffer circuit is provided for applying a predetermined voltage to the substrate electrode of one of the p- and n-channel metal oxide semiconductor field effect transistors so as to decrease a change in a threshold voltage due to the source-substrate bias effect.

7 Claims, 27 Drawing Figures

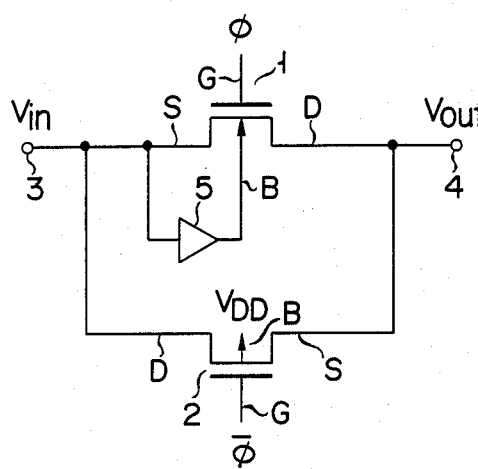
F I G. 1
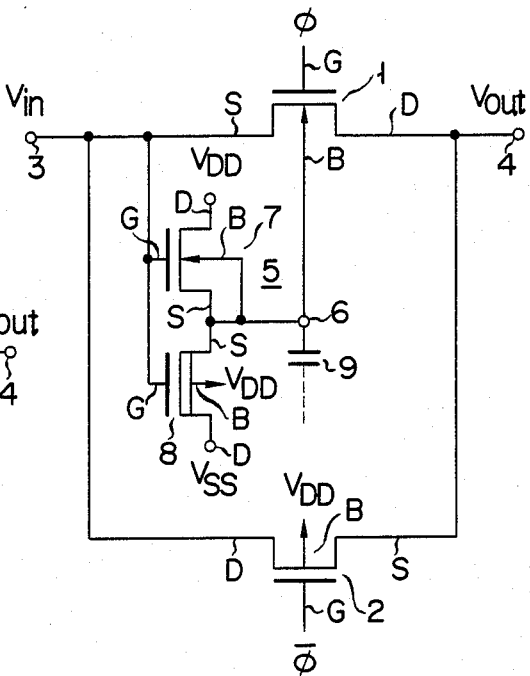
F I G. 2
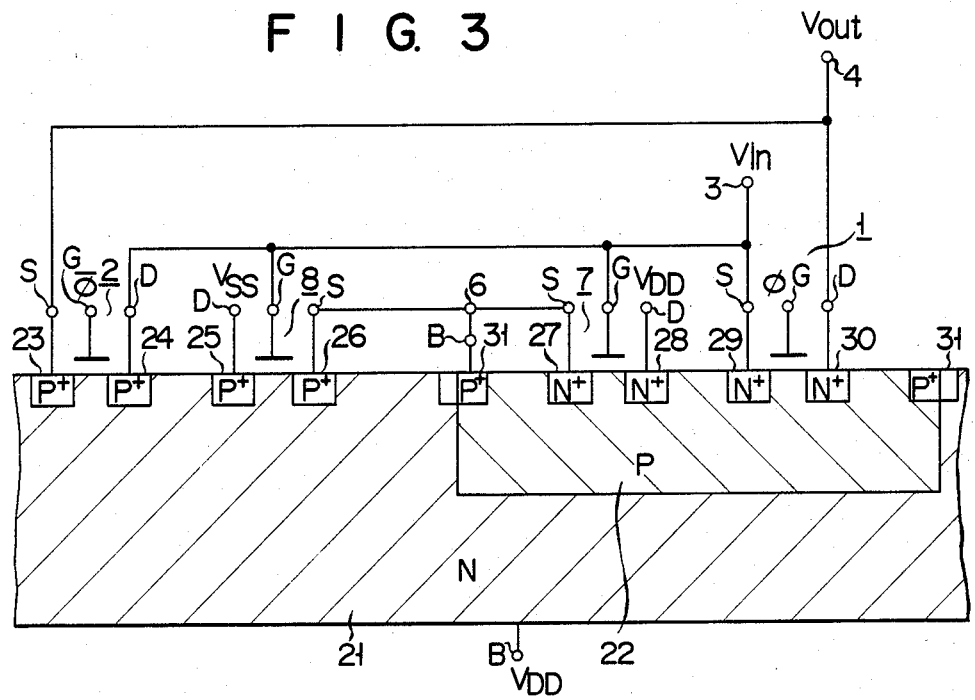
F I G. 3

F I G. 4
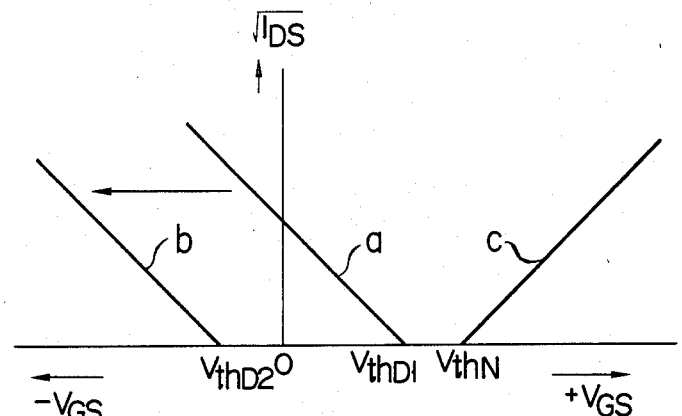
F I G. 5
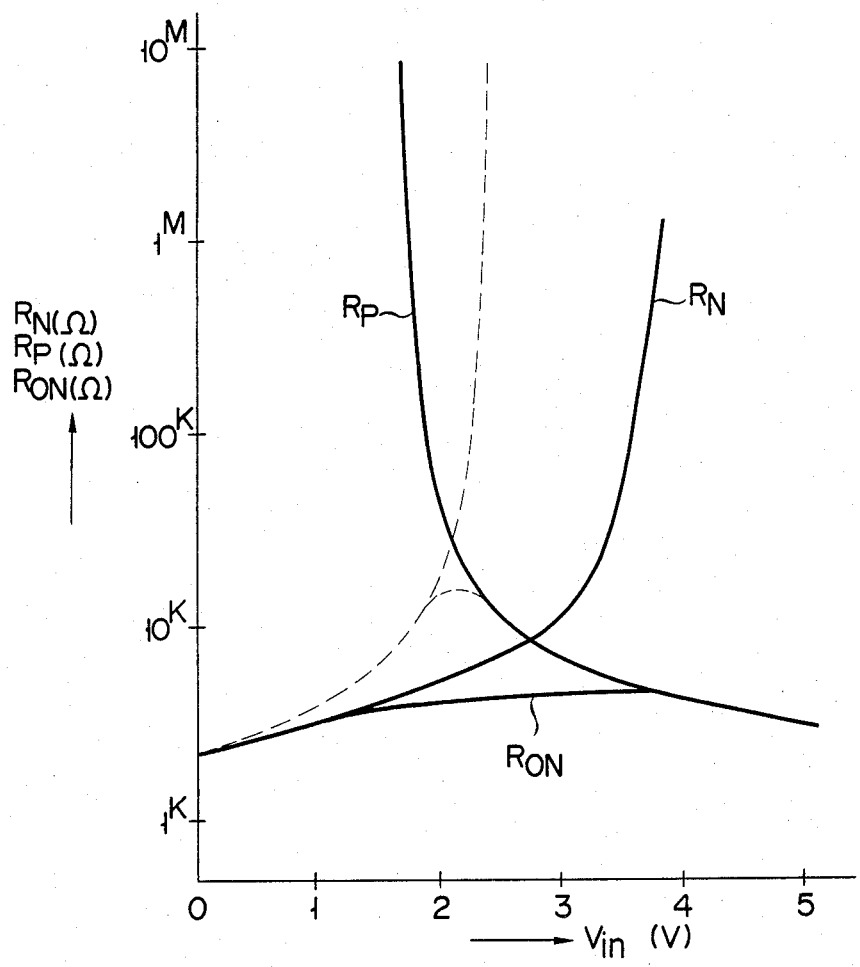

F I G. 9
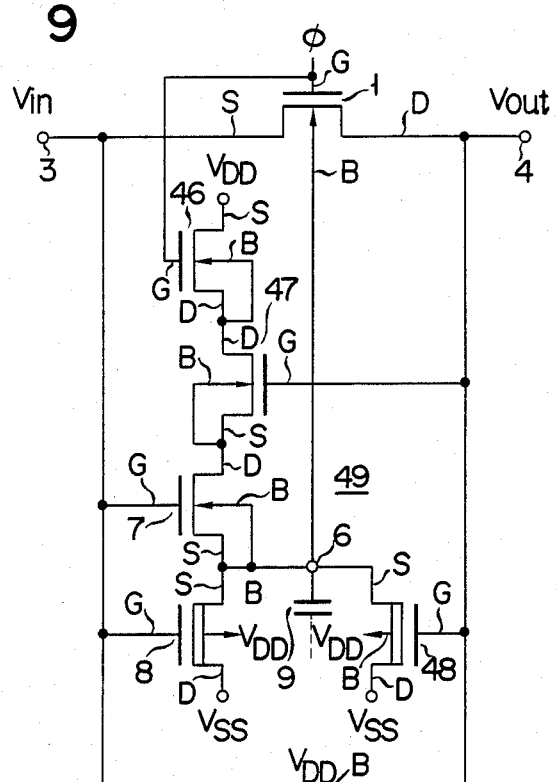
F I G. 10
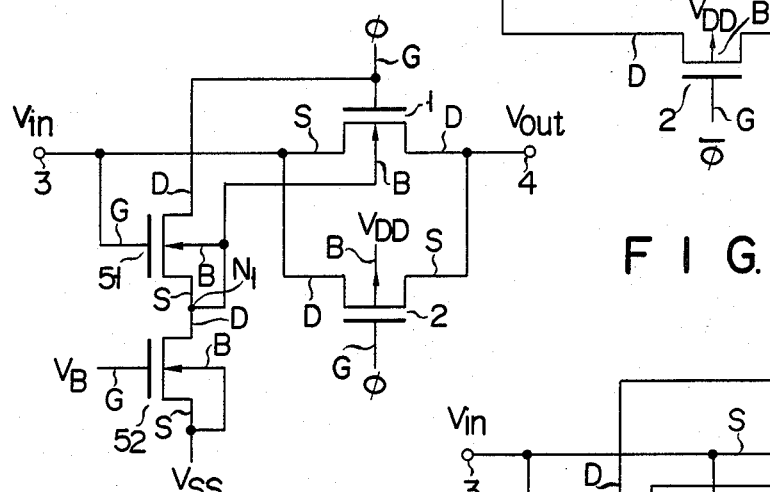
F I G. 11
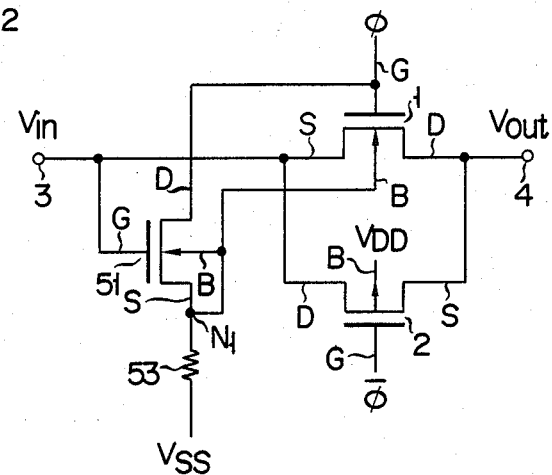

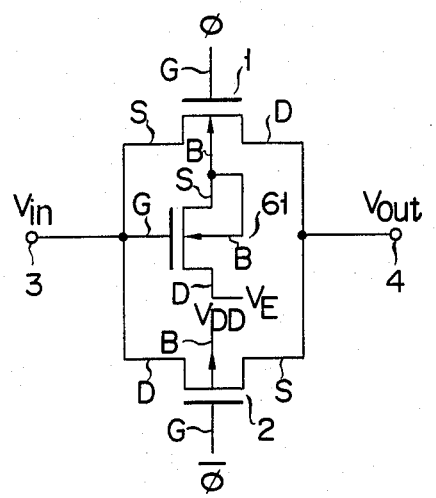
F I G. 18
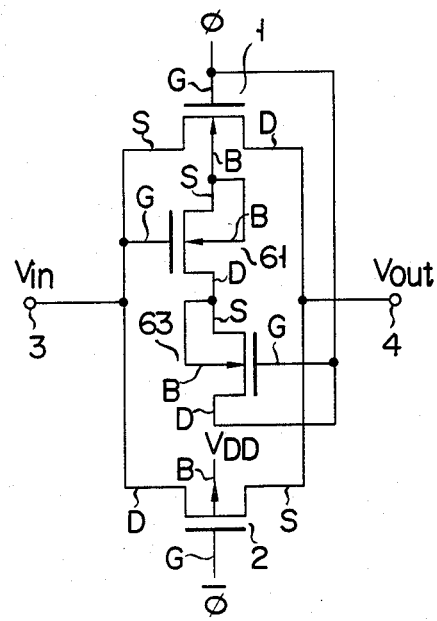
F I G. 19
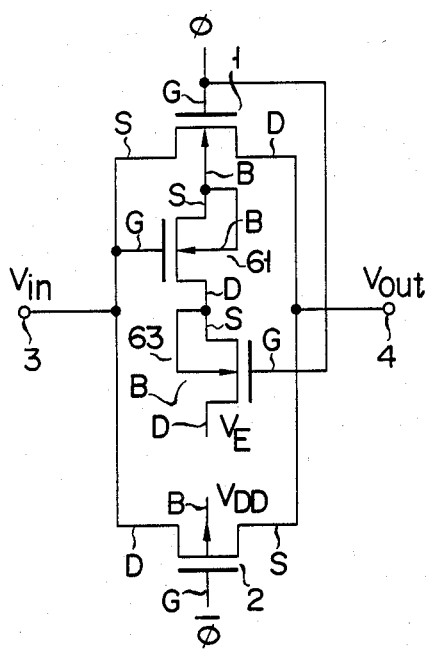
F I G. 20
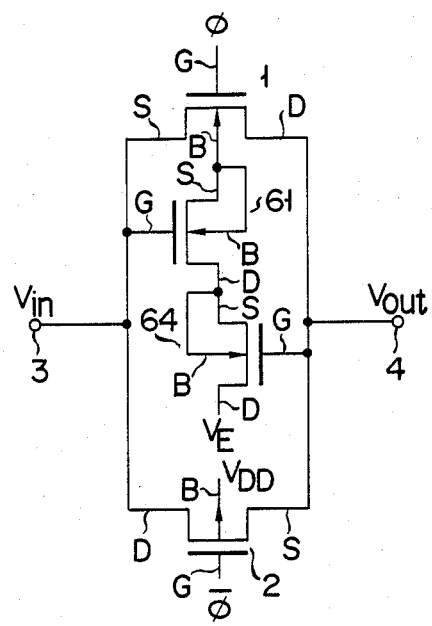
F I G. 21

ANALOG SWITCH DEVICE HAVING THRESHOLD CHANGE REDUCING MEANS

BACKGROUND OF THE INVENTION

The present invention relates to an analog switch device using MOS transistors.

An analog switch device transmits an analog input signal when set to ON, while the device does not transmit the analog input signal when set to OFF. The analog switch device of this type preferably produces a voltage signal which is equal to or linearly proportional to the input signal. For this purpose, an input-output resistance of the analog switch device must be kept constant. However, if MOS transistors are used in the analog switch device, an output voltage of the analog switch becomes non-linear in relation to the input voltage. This is because the MOS transistors have a source-substrate bias effect, causing the resistance of the MOS transistors to become non-linear. An analog switch device is proposed which utilizes this resistance characteristic of CMOS transistors. However, in the analog switch device using the CMOS transistors, an impurity concentration of a substrate region of an n-channel MOS transistor is generally higher than that of a substrate region of a p-channel MOS transistor. As a result, the source-substrate bias effect of the n-channel MOS transistor is greater than that of the p-channel MOS transistor. A change in the resistance of the n-channel MOS transistor which is obtained in response to the input analog signal is greater than that of the p-channel MOS transistor, so that significant distortion of an output analog signal occurs.

U.S. Pat. No. 3,720,848, for example, discloses a means for solving this problem. In an analog switch disclosed in the above patent specification, a means is provided for selectively forming a short circuit between a source region and one substrate region of the n- and p-channel transistors when either the n- or p-channel transistor is rendered conductive. However, in this device, since the source region and the substrate region are shortcircuited, the potential at the drain region becomes lower than that of the substrate region. Note that a parasitic npn bipolar transistor is formed having a drain region of the n-channel transistor as an emitter, a substrate region of the n-channel transistor as a base, and a substrate region of the p-channel transistor as a collector. If the potential of the emitter is lower than that of the base as described above, the emitterbase path is forward biased, resulting in flow of a wasteful current through the bipolar transistor.

SUMMARY OF THE INVENTION

It is, therefore, an object of the present invention to provide an analog switch device for maintaining a resistance between input and output ends constant independently of an analog signal, and also for obtaining an output signal with a small distortion.

It is another object of the present invention to provide an analog switch device for preventing flow of a wasteful current through a parasitic bipolar transistor.

According to the present invention, a means is provided for applying a predetermined voltage to a substrate electrode of at least one of a pair of MOS transistors constituting the analog switch device, so as to decrease a threshold voltage change due to a source-substrate bias effect.

In an analog switch device according to another embodiment of the present invention, the predetermined voltage for constantly reverse biasing a substrate region and source and drain regions is supplied to the substrate electrode by the means described above.

The predetermined voltage is preferably a voltage which depends upon at least one of the input and output analog signals.

In an analog switch device according to still another embodiment of the present invention, a voltage which is higher than a voltage caused by the sourcesubstrate bias effect of the MOS transistor due to a change in an analog signal is applied in advance to the substrate electrode of the MOS transistor.

BRIEF DESCRIPTION OF THE DRAWINGS

Other objects and advantages will be apparent from the following description taken in connection with the accompanying drawings in which:

FIG. 1 is a circuit diagram of an analog switch device according to the first embodiment of the present invention;

FIG. 2 is a circuit diagram of the device shown in FIG. 1 including a detailed circuit diagram of a voltage buffer circuit;

FIG. 3 is a sectional view of the analog switch device shown in FIG. 2;

FIG. 4 is a graph showing $V_{GS}$-$\sqrt{I_{DS}}$ characteristics of a MOS transistor of the type used in the voltage buffer circuit shown in FIG. 2;

FIG. 5 is a graph explaining resistances RP of the p-channel MOS transistors, resistances RN of the n-channel MOS transistors and parallel resistances RON of the resistances RN and RP of the analog switch as a function of an analog signal Vin according to the analog switch device of the present invention and of a conventional analog switch device, respectively;

FIG. 9 is a circuit diagram of an analog switch device according to the third embodiment of the present invention;

FIG. 10 is a circuit diagram of an analog switch device according to the fourth embodiment of the present invention;

FIGS. 11 to 15 are circuit diagrams of modifications of the analog switch device shown in FIG. 10;

FIGS. 17 to 24 are circuit diagrams of modifications of the analog switch device shown in FIG. 16;

DETAILED DESCRIPTION OF THE PREFERRED EMBODIMENTS

Figure 6:
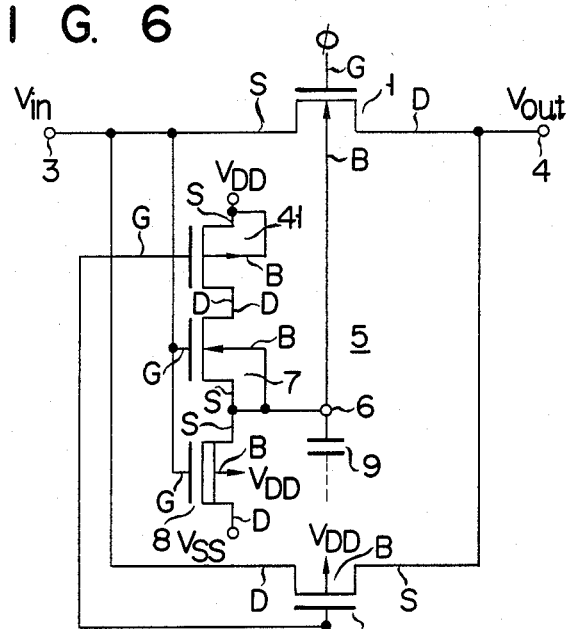
FIG. 6 is a circuit diagram of a modification of the analog switch device shown in FIG. 2.

An analog switch device according to the first embodiment of the present invention will be described with reference to FIG. 1. A source electrode S of an enhancement-type n-channel MOS transistor 1 is connected to a drain electrode D of an enhancement-type p-channel MOS transistor 2, and a node therebetween is connected to an input end 3 to which an analog input signal Vin is applied. A drain electrode D of the MOS transistor 1 is connected to a source electrode S of the MOS transistor 2, and a node therebetween is connected to an output end 4 at which an analog output signal Vout appears. A gate electrode G of the MOS transistor 1 receives a clock pulse $\phi$, while a gate electrode G of the MOS transistor 2 receives a clock pulse $\bar{\phi}$ which is obtained by an inversion of the clock pulse $\phi$. A positive power source voltage VDD corresponding to the high level (H level) of the clock pulses $\phi$ and $\bar{\phi}$ is applied to a substrate electrode B of the MOS transistor 2. An input end of a voltage buffer circuit (voltage supplying means) 5 which generates a voltage in correspondence with the analog input signal Vin is connected to the input end 3. The voltage buffer circuit 5 applies a predetermined voltage to a substrate electrode B of the MOS transistor 1. The predetermined voltage depends upon the input analog signal Vin.

FIG. 2 shows a circuit diagram of the analog switch device having a detailed circuit diagram of the voltage buffer circuit 5. The voltage buffer circuit 5 comprises an enhancement-type n-channel MOS transistor 7 and a depletion-type p-channel MOS transistor 8. The MOS transistor 7 has a drain electrode D connected to an end to which the power source voltage VDD is applied, a source electrode S connected to a voltage output end 6, a gate electrode G connected to the input end 3, and a substrate electrode B connected to the output end 6. Similarly, the MOS transistor 8 has a source electrode S connected to the output end 6, a drain electrode D connected to an end to which a power source voltage VSS is applied, a gate electrode G connected to the input end 3, and a substrate electrode B connected to the end to which the power source voltage VDD is applied. The output end 6 of the voltage buffer circuit 5 is connected to the substrate electrode B of the MOS transistor 1. A parasitic capacitor 9 is equivalently connected to the output end 6.

FIG. 3 is a sectional view of the analog switch device having the voltage buffer circuit 5 shown in FIG. 2. A p-type well region 22 is formed in an n-type semiconductor substrate 21. Source and drain regions 23 and 24 of the MOS transistor 2 to which a p-type impurity is diffused are formed in a surface layer of the semiconductor substrate 21. Drain and source regions 25 and 26 of the MOS transistor 8 are also formed in the surface layer of the semiconductor substrate 21. Similarly, source and drain regions 27 and 28 of the MOS transistor 7 to which an n-type impurity is diffused are formed in a surface layer of the p-type well region 22. Source and drain regions 29 and 30 of the MOS transistor 1 are also formed in the surface layer of the p-type well region 22. A p-type contact region 31 is formed at a boundary between the p-type well region 22 and the semiconductor substrate 21 so as to surround the p-type well region 22. The contact region 31 has an impurity concentration higher than that of the p-type well region 22 and contacts well with the p-type well region 22.

The source electrodes S are deposited on the source regions 23, 26, 27 and 29, respectively. The drain electrodes D are deposited on the drain regions 24, 25, 28 and 30, respectively. The substrate electrodes B of the MOS transistors 1 and 7 are deposited on the contact region 31. The gate electrode G is formed on the semiconductor substrate 21 between the source region 23 and the drain region 24. Similarly, the gate electrodes G are formed on the semiconductor substrate 21 between the drain region 25 and the source region 26, on the p-type well region 22 between the source region 27 and the drain region 28, and on the p-type well region 22 between the source region 29 and the drain region 30, respectively. The semiconductor substrate 21 receives the power source voltage VDD through the substrate electrode B. The parasitic capacitor 9 in FIG. 2 is formed by a p-n junction between the p-type well region 22 and the semiconductor substrate 21.

The mode of operation of the analog switch device with the above arrangement will be described. In order to simultaneously maintain the ON state of the MOS transistors 1 and 2, the clock pulse $\phi$ must be set to H level (VDD) and the clock pulse $\bar{\phi}$ must be set to L level (VSS). The analog input signal Vin is set to 0 V (VSS level). In this condition, only the depletion-type MOS transistor 8 is ON, so that a voltage at the output end 6 of the voltage buffer circuit 5 is the difference between a threshold voltage VthD of the MOS transistor 8 and a voltage corresponding to the analog input signal Vin. The output voltage from the voltage buffer circuit 5 is supplied to the p-type well region 22 shown in FIG. 3. If the voltage of the p-type well region 22 is defined as Vp-well:

$$Vp\text{-well} = Vin - VthD \quad (1)$$

If the parasitic capacitor 9 connected to the output end 6 of the voltage buffer circuit 5 is charged in advance with the power source voltage VDD (e.g., +5 V), the voltage Vp-well of the p-type well region 22 is lowered to a value expressed by equation (1) when the MOS transistor 8 is turned on.

When the voltage of the output end 6 is kept at +5 V, the source electrode S of the MOS transistor 8 is also kept at +5 V. The power source voltage VDD of +5 V is constantly supplied to the substrate electrode B of the MOS transistor 8. Therefore, immediately after the MOS transistor 8 is turned on, a back-gate bias voltage (source-substrate bias voltage) VBS of the MOS transistor 8 is 0 V. The threshold voltage of the MOS transistor 8 is indicated by a positive voltage VthD1 in FIG. 4. The current characteristics between the drain and the source of the MOS transistor 8 are indicated by a line a in FIG. 4. Subsequently, after the MOS transistor 8 is turned on, the voltage Vp-well reaches the value given by equation (1). Therefore, the voltage of the source electrode S of the MOS transistor 8 is decreased from +5 V and comes close to 0 V. As a result, the source-substrate bias voltage VBS of the MOS transistor 8 is gradually increased. Along with this increase, the threshold voltage VthD1 of the MOS transistor 8 is shifted to the left, as shown in FIG. 4. Simultaneously, a line indicating the current characteristic of the drain-source path is also shifted to the left, parallel to the line a. If the new threshold voltage VthD2 of the MOS transistor 8 is almost 0 V, as shown in FIG. 4, and if the MOS transistor 8 is of the enhancement type, the voltage Vp-well passes close to 0 V.

Assume that a voltage corresponding to the analog signal Vin increases from 0 V to a positive voltage. When a gate-source voltage Vin−Vp-well of the MOS transistor 7 becomes larger than a threshold voltage VthN of the MOS transistor 7, the MOS transistor 7 is turned on. Therefore, the parasitic capacitor 9 is gradually charged with the power source voltage VDD. In this condition, the MOS transistor 8 is in the "on" state and a current corresponding to the drain-source current characteristics, as indicated by line c, flows through the MOS transistor 7. As a result, the voltage Vp-well at the output end 6 increases to the voltage Vin−VthN. Assume that VthN=+1 V and VDD=+5 V. If the voltage corresponding to the analog signal Vin increases from 0 V to +5 V, a voltage which increases from 0 V to +4 V is applied to the substrate electrode B of the MOS transistor 1.

Assume that the voltage corresponding to the analog signal Vin decreases from +5 V to 0 V. When the voltage corresponding to the analog signal Vin gradually decreases from +5 V, the voltage Vin−Vp-well becomes lower than the threshold voltage VthN of the MOS transistor 7. Therefore, the MOS transistor 7 is turned off. Also assume that the threshold voltage VthDl of the MOS transistor 8 is set to +0.6 V when the sourcesubstrate bias voltage VBS thereof is set to 0 V. If the analog signal is set at +5 V and if the voltage Vp-well is set to +4 V, the source-substrate bias voltage VBS of the MOS transistor 8 is set to about 1 V (5−4). Further, if the threshold voltage VthDl of the MOS transistor 8 is shifted to +0.2 V due to the source-substrate bias voltage VBS, the MOS transistor 8 is turned on when the voltage corresponding to the analog signal Vin is lowered to +4.2 V (4 +0.2). Therefore, the voltage Vp-well through the MOS transistor 8 is reduced almost to 0 V.

Assume now that the clock pulse $\phi$ is set to L level, while the clock pulse $\bar{\phi}$ is set to H level. Since the MOS transistors 1 and 2 are both OFF, the resistances RN and RP at both ends thereof are greatly increased. As a result, the analog signal Vin is not transmitted to the output end 4 and the analog signal Vout is not produced.

FIG. 5 is a graph explaining the effects obtained by the analog switch device of the present invention. The graph indicates the relationships among a resistance RN of the MOS transistor 1, a resistance RP of the MOS transistor 2, and a parallel resistance RON between the resistances RN and RP, as a function of the analog input signal Vin, when the MOS transistors 1 and 2 of the analog switch device are ON, as indicated by the solid line. The broken line indicates the resistance characteristics of a conventional analog switch device. In the conventional analog switch device, the resistance RON is very high when the analog input signal Vin is set to about +2.5 V. This is because the sensitivity of the threshold voltage of the n-channel MOS transistor to the source-substrate bias effect is higher than that of the threshold voltage of the p-channel MOS transistor thereto. In particular, the n-channel MOS transistor is generally formed in the p-type well region which is formed in the n-type semiconductor substrate in which the p-channel transistor is formed. Further, the impurity concentration of the p-type well region is generally higher than that of the n-type semiconductor substrate. As a result, the impurity concentration of the p-type well region results in a high sensitivity of the n-channel MOS transistor.

However, in the above embodiment, curves indicating the resistances RN and RP are symmetrical about an axis at about +2.5 V. As described above, since a voltage substantially in proportion to the analog input signal Vin is applied to the substrate electrode B of the n-channel MOS transistor 1, the source-substrate bias effect of the MOS transistor 1 is substantially constant. Therefore, the resistance RON between the input and output ends 3 and 4 is kept substantially constant independently of the analog input signal Vin. As a result, the distortion of the analog output signal Vout is very small.

In the above embodiment, in order to determine a voltage at the output end 6 of the voltage buffer circuit 5, the n-channel MOS transistor 7 and the p-channel MOS transistor 8 are not set to ON simultaneously. A current will not substantially flow between the power source voltages VDD and VSS of the voltage buffer circuit 5 through a series circuit of the MOS transistors 7 and 8. As a result, any increase in current consumption will be very small. If current consumption is not an issue, a resistor may be connected in place of the depletion-type p-channel MOS transistor 8.

The gate electrodes G of the MOS transistors 7 and 8 may be connected to the output end 4, and a predetermined voltage may be applied to the substrate electrode B of the MOS transistor 1.

Further, the analog input signal Vin may be applied to the output end 4, while the analog output signal Vout may be produced at the input end 3.

The analog switch device may comprise the n-channel MOS transistor 1 formed in a p-type semiconductor substrate and the p-channel MOS transistor 2 formed in an n-type well region which is formed by the diffusion method in the p-type semiconductor substrate. In this case, the sensitivity of the threshold voltage of the p-channel MOS transistor 2 to the source-substrate bias effect is higher than that of the threshold voltage of the n-channel MOS transistor 1. In this case, a bias voltage corresponding to the voltage at the input or output end 3 or 4 need only be applied to the substrate electrode B of the p-channel MOS transistor 2.

If the impurity concentrations of the substrates of the n- and p-channel MOS transistors 1 and 2 respectively are high, a bias voltage corresponding to the analog input signal Vin or the analog output signal Vout may be applied to the substrate electrodes B of the MOS transistors 1 and 2.

A modification of the analog switch device according to the first embodiment of the present invention will be described with reference to FIG. 6. The voltage buffer circuit 5 of the analog switch device shown in FIG. 1 further comprises an enhancementtype p-channel MOS transistor 41, a gate electrode G of which receives the clock signal $\bar{\phi}$. The MOS transistor 41 connects the MOS transistor 7 to the power source voltage VDD. With the above arrangement, the voltage buffer circuit 5 is operated only when the MOS transistors 1 and 2 are simultaneously ON. In other words, the voltage Vp-well corresponding to the analog input signal Vin is applied to the substrate electrode B of the MOS transistor 1 only when the analog input signal Vin is transmitted to the output end 4.

Figure 7:
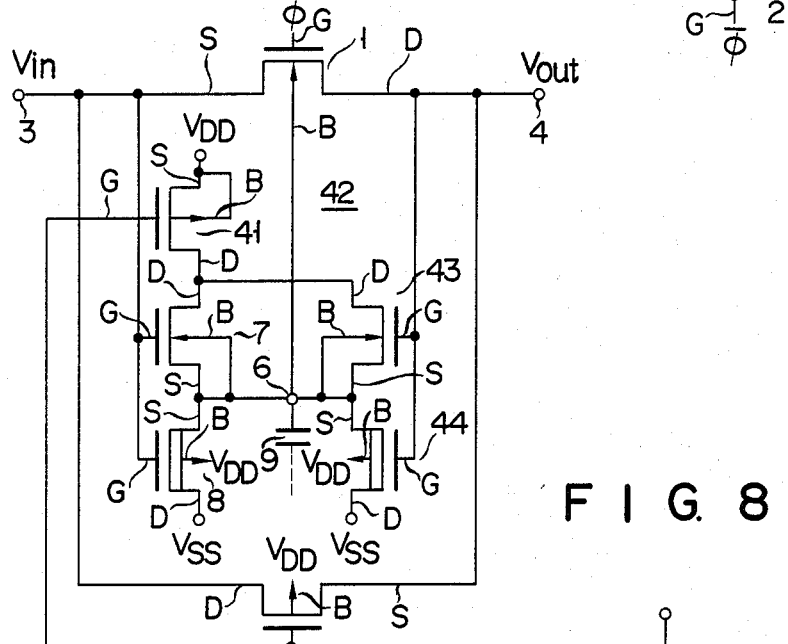
FIG. 7 is a circuit diagram of an analog switch device according to the second embodiment of the present invention.

An analog switch device according to a second embodiment of the present invention will be described with reference to FIG. 7. A voltage buffer circuit 42 of this analog switch device has an enhancement-type n-channel MOS transistor 43 and a depletion-type p-channel MOS transistor 44 in addition to the voltage buffer circuit 5 shown in FIG. 1. A drain electrode D of the MOS transistor 43 is connected to a drain electrode D of the MOS transistor 41. Source and substrate electrodes S and B of the MOS transistor 43 are connected to the output end 6. Similarly, a gate electrode G of the MOS transistor 43 is connected to the output end 4. Source, drain, substrate and gate electrodes S, D, B and G of the MOS transistor 44 are connected to the output end 6, the power source voltage VSS, the power source voltage VDD and the output end 4, respectively. In the second embodiment, two voltage buffer circuits are arranged. The analog input signal Vin is supplied to one of the voltage buffer circuits, while the analog output signal Vout is supplied to the other voltage buffer circuit. With this arrangement, a voltage at the output end 6 is highly responsive to a change in the analog input signal Vin. The MOS transistor 41 is arranged to apply the voltage Vp-well corresponding to the analog input signal Vin to the substrate electrode B of the MOS transistor 1 only when the analog input signal Vin is transmitted to the output end in the same manner as in the modification of the first embodiment shown in FIG. 6.

Figure 8:
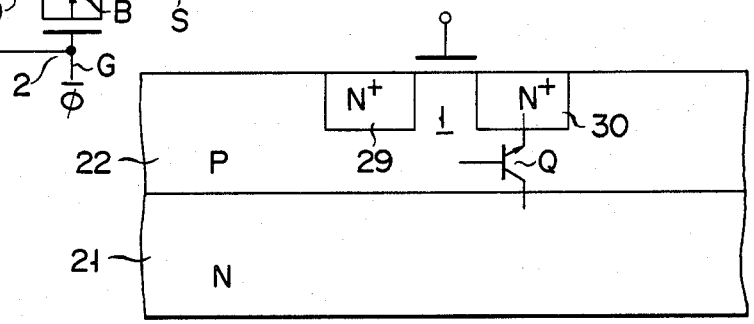
FIG. 8 is a schematic sectional view of a parasitic bipolar transistor formed in the analog switch device.

As shown in FIG. 3, the drain region 30 of the MOS transistor 1 has an n-type conductivity, the p-type well region 22 has a p-type conductivity, and the substrate 21 has an n-type conductivity. Therefore, as shown in FIG. 8, a parasitic bipolar-type npn transistor Q is formed having the drain region 30 as an emitter region thereof, the p-type well region 22 as a base region thereof, and the semiconductor substrate 21 as a collector region thereof. When a surge current flows between the source and the drain of the MOS transistor 1, a voltage drop occurs between the source and the drain thereof due to an ON resistance of the MOS transistor 1. The voltage at the drain region 30 becomes lower than that of the source region 29. Meanwhile, a voltage corresponding to the difference between the analog input signal Vin of the source region 29 and the threshold voltage capital VthN of the MOS transistor 7 is applied from the voltage buffer circuit 42 to the p-type well region 22. Therefore, the threshold voltage VthN of the MOS transistor 7 prevents the base-emitter path of the bipolar transistor from being forward biased. As a result, a wasteful current does not flow from the semiconductor substrate 21 biased at the power source voltage VDD to the drain region 30.

An analog switch device which more completely prevents the increase in current consumption described above according to the third embodiment of the present invention will be described with reference to FIG. 9.

A voltage buffer circuit 49 of the analog switch device according to the third embodiment has, in addition to the circuit shown in FIG. 1, an enhancement-type n-channel MOS transistor 46, a gate electrode G of which receives the clock pulse $\phi$, and an enhancement-type n-channel MOS transistor 47, a gate electrode G of which is connected to the output end 4. The MOS transistors 46 and 47 are series-connected between the power source voltage VDD and the drain electrode D of the MOS transistor 7.

Further, the voltage buffer circuit 49 has a depletion-type p-channel MOS transistor 48, a conductive path (drain-source path) of which is formed between the output end 6 and the power source voltage VSS, and a gate electrode G of which is connected to the output end 4. The voltage buffer circuit 49 causes the MOS transistor 46 to turn on or off in response to the clock pulse $\phi$. Voltages at a source electrode S of the MOS transistor 47 and the drain electrode D of the MOS transistor 7 are always below the analog output signal Vout since the MOS transistor 47 is controlled by the analog output signal Vout. Thus, a voltage in the base region, that is, the p-type well region 22, of the bipolar transistor Q as shown in FIG. 8 is not more than the analog output signal Vout. As a result, the base-emitter path of the bipolar transistor Q is reverse biased, and no current may flow through the bipolar transistor Q. Note that the depletion-type MOS transistor 48 is arranged to accelerate discharge of the parasitic capacitor 9 connected to the output end 6 and to reduce the voltage Vp-well almost to 0 V.

An analog switch device according to a fourth embodiment of the present invention will be described with reference to FIG. 10.

In order to apply a predetermined voltage to the substrate electrode B of the MOS transistor 1, enhancement-type n-channel MOS transistors 51 and 52 are series-connected between the gate electrode G of the MOS transistor 1 and the power source voltage VSS. A node N1 between a source electrode S of the MOS transistor 51 and a drain electrode D of the MOS transistor 52 is connected to the substrate electrode B of the MOS transistor 1. A substrate electrode B of the MOS transistor 51 is connected to the source electrode S thereof and a gate electrode G of the MOS transistor 51 is connected to the input end 3. A substrate electrode B of the MOS transistor 52 is connected to a source electrode S thereof. A gate electrode G of the MOS transistor 52 receives a constant voltage VB. Therefore, the ON resistance of the MOS transistor 51 varies according to the analog input signal Vin, while the ON resistance of the MOS transistor 52 is set to a predetermined value by the voltage VB. If the clock pulse $\phi$ is set to H level (VDD), a voltage potential-divided by the MOS transistors 51 and 52 is supplied to the substrate electrode B of the MOS transistor 1. The n-channel MOS transistor 1 is formed in the p-type well region formed in the n-type semiconductor substrate by the diffusion method. The p-channel MOS transistor 2 is formed in the n-type semiconductor substrate. The dimensions of the MOS transistor 51 are larger than those of the MOS transistor 52.

Assume that the clock pulse $\phi$ is set to H level and the clock pulse $\bar{\phi}$ is set to L level in the analog switch device described above. The MOS transistors 1 and 2 are then set to ON. If the analog input signal Vin is sufficiently high, the MOS transistor 51 is kept in the ON condition completely. The MOS transistor 52 has a given resistance. If the ON resistance of the MOS transistor 51 is defined as RN51, and the ON resistance of the MOS transistor 52 is defined as RN52, a voltage VN1 at the node N1 is defined by the following equation:

$$VN1 = (RN52 \cdot VDD + RN51 \cdot VSS)/(RN51 + RN52) \quad (2)$$

A predetermined voltage VN1 may be obtained by suitably selecting the ON resistance RN51 and RN52. For example, the voltage VN1 can be determined to be substantially equal to that of the source electrode S of the MOS transistor 1. Further, if the dimensions of the MOS transistor 51 are sufficiently larger than those of the MOS transistor 52, the voltage VN1 is set to a value Vin−|Vth51| which is smaller than the analog input signal Vin by an absolute value |Vth51| of the threshold voltage Vth51. Therefore, the source-substrate bias voltage of the MOS transistor 1 becomes at most the absolute value |Vth51| of the threshold voltage of the MOS transistor 51. The absolute value |Vth51| is kept constant substantially independently of the analog input signal Vin, so that the source-substrate bias effect of the MOS transistor 1 is very small.

Further, if the ON resistances RN51 and RN52 are suitably determined, the parasitic diode formed between the drain region of the MOS transistor 1 and the substrate region thereof is constantly reverse biased. Therefore, no excessive current flows from the parasitic diode, and the analog switch device operates stably according to the present invention.

If the clock pulse $\phi$ is set to L level and the clock pulse $\bar{\phi}$ is set to H level, the MOS transistors 1 and 2 are turned off. The resistances RN and RP are increased and the analog input signal Vin may not be transmitted to the output end 4.

The characteristics of the resistances RP, RN and RON of the analog switch device according to the fourth embodiment of the present invention are the same as those shown in FIG. 5. Curves indicating the resistances RN and RP as a function of the analog input signal Vin are symmetrical about an axis at about 2.5 V. Therefore, the resistance RON is kept constant independently of the analog input signal Vin, so that a distortion of the analog output signal Vout is very small.

FIGS. 11 to 15 are modifications of the analog switch of the fourth embodiment shown in FIG. 10.

An analog switch device in FIG. 11 has a resistor 53 in place of the MOS transistor 52.

Figure 12:
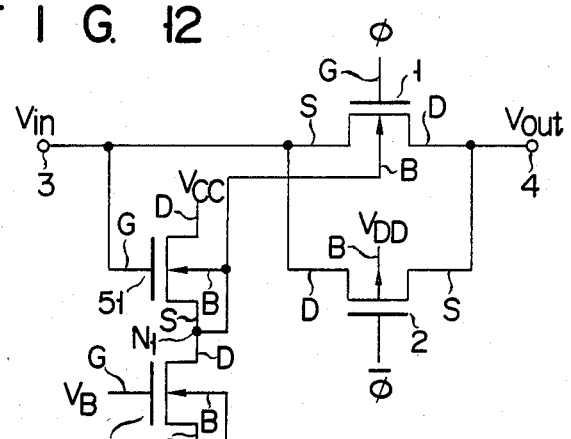

An analog switch device in FIG. 12 is the same as that in FIG. 10 except that the drain electrode D of the MOS transistor 51 is connected to the power source voltage VCC in place of the gate electrode G of the MOS transistor 1.

Figure 13:
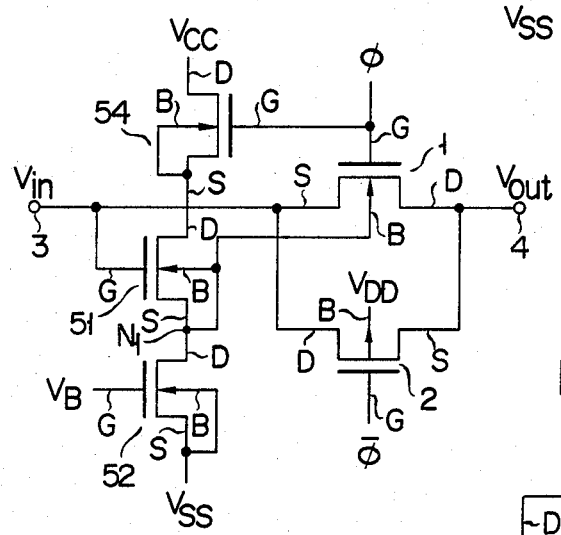

An analog switch device in FIG. 13 is the same as that in FIG. 10 except that the drain electrode D of the MOS transistor 51 is connected to a point at the power source voltage VCC through the enhancement-type n-channel MOS transistor 54 which is controlled by the clock pulse $\phi$ instead of being directly connected to a point to which the power source voltage VCC is applied.

Figure 14:
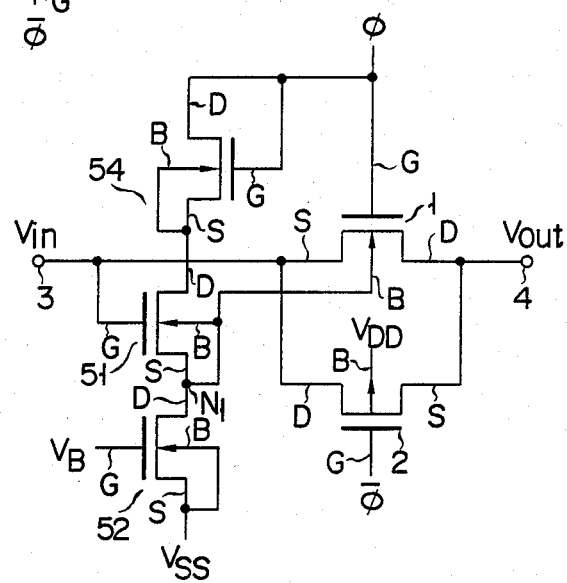

An analog switch device in FIG. 14 is the same as that in FIG. 13 except that the drain electrode D of the MOS transistor 54 is connected to a point to which the clock pulse $\phi$ is applied, instead of being connected to the point to which the power source voltage VCC is applied.

Figure 15:
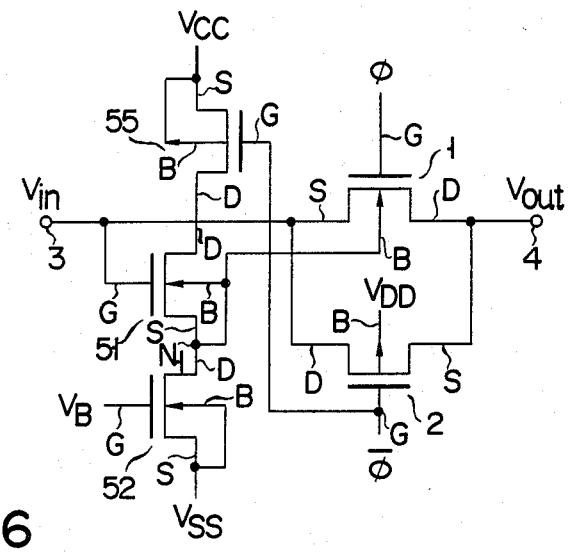

An analog switch device in FIG. 15 is the same as that in FIG. 13 except that an enhancement-type p-channel MOS transistor 55 which is controlled by the clock pulse $\bar{\phi}$ is incorporated in place of the enhancement-type n-channel MOS transistor 54.

The analog switch devices in FIGS. 11 to 15 can obtain the same effects as shown in FIG. 5. The distortion of the analog output signal Vout is very small. Further, the parasitic diode formed between the drain and substrate regions of the MOS transistor 1 is constantly reverse biased.

In the analog switch devices of the fourth embodiment and its modifications, the analog input signal Vin may be supplied to the output end 4 and the analog output signal Vout may be produced at the input end 5.

Further, the substrate electrodes B of the transistors except for the MOS transistors 1 and 2 may be connected to points at other potentials instead of the source electrodes S.

As described above, each of the analog switch devices of the fourth embodiment and its modifications has first and second impedance means which are connected in series between a pair of predetermined power source voltages. The first impedance means changes its impedance in response to the analog signal, while the second impedance means has a predetermined impedance. A bias voltage corresponding to the analog signal Vin is produced at the node between the first and second impedance means.

An analog switch device according the fifth embodiment of the present invention will be described with reference to FIG. 16. The clock pulse $\phi$ is supplied to the substrate electrode B of the MOS transistor 1 through an enhancement-type n-channel MOS transistor 61. A gate electrode G of the MOS transistor 61 receives the analog input signal Vin. The p-channel MOS transistor 2 is formed in the n-type semiconductor substrate, while the n-channel MOS transistor 1 is formed in the p-type well region formed by the diffusion method in the n-type semiconductor substrate.

If the clock pulse $\phi$ is set to H level and the clock pulse $\bar{\phi}$ is set to L level, the MOS transistors 1 and 2 are both ON. With the analog input signal Vin at VDD/2 (= +2.5 V), i.e. the resistance RON at a high value in the conventional analog switch device, the MOS transistor 61 is ON. A voltage at the substrate electrode B of the MOS transistor 1 comes close to Vin−Vth61=VDD/2−Vth61 (where Vth61 is the threshold voltage of the MOS transistor 61). Therefore, the source-substrate bias voltage VBS of the MOS transistor 1 is at most the threshold voltage Vth61 of the MOS transistor 61. The threshold voltage Vth61 is kept substantially constant independently of the analog input signal Vin, so that the source-substrate bias effect on the MOS transistor 1 is very small. Therefore, a change in the ON resistance of the MOS transistor 1 due to a change in the threshold voltage is substantially eliminated.

However, if the clock pulse $\phi$ is set to L level and the clock pulse $\bar{\phi}$ is set to H level, the MOS transistors 1 and 2 are OFF. Therefore, the resistances RN and RP are greatly increased and the analog input signal Vin is not transmitted to the output end 4.

The characteristics of the resistances RN, RP and RON of the analog switch device according to the fifth embodiment are the same as those shown in FIG. 5. The curves indicating the resistances RN and RP obtained in response to the analog input signal Vin are symmetrical about the axis at about 2.5 V. Therefore, the resistance RON is kept constant independently of the analog input signal Vin. This is because the MOS transistor 61 which receives the analog input signal Vin at its gate electrode G is arranged between the substrate electrode B of the MOS transistor 1 and the point to which the clock pulse $\phi$ is supplied. Since a voltage substantially equal to the analog input signal Vin is supplied to the substrate electrode B of the MOS transistor 1, the source-substrate bias effect of the MOS transistor 1 is very small.

In the analog switch device of the fifth embodiment, the parasitic diode formed between the drain and substrate regions of the MOS transistor 1 can also be constantly reverse biased. If the threshold voltage of the MOS transistor 1 is defined as Vth1, a voltage of at most Vin−Vth1 is supplied to the drain electrode D of the MOS transistor 1. Meanwhile, the source electrode S of the MOS transistor 61 receives the voltage of at most Vin−Vth61. Therefore, a voltage Vin−Vth61−(Vin−Vth1)=Vth1−Vth61 is applied between the anode and the cathode of the parasitic diode. If the threshold voltage Vth1 is greater than the threshold voltage Vth61, the parasitic diode is constantly reverse biased.

Figure 16:
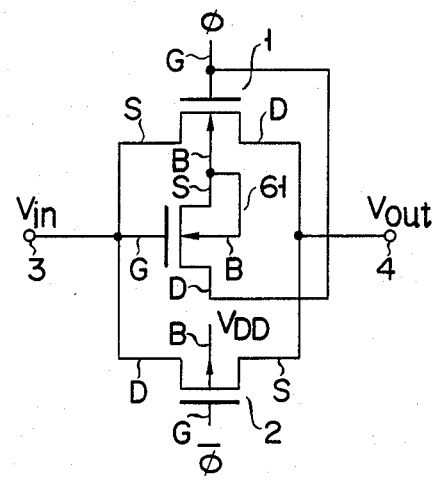
FIG. 16 is a circuit diagram of an analog switch device according to the fifth embodiment of the present invention.

FIGS. 17 to 24 are modifications of the analog switch device of the fifth embodiment shown in FIG. 16.

Figure 17:
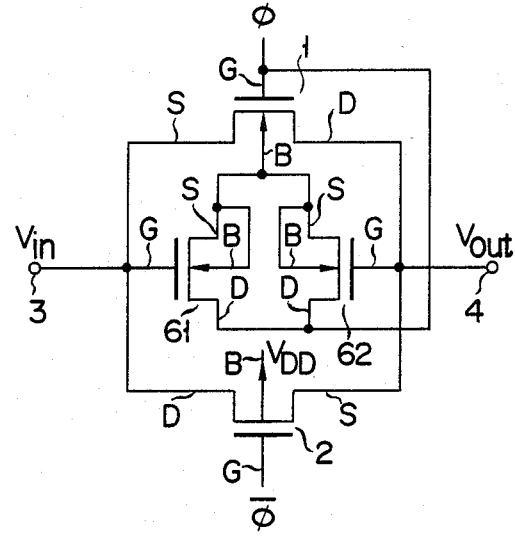

An analog switch device in FIG. 17 has an additional n-channel MOS transistor 62 which is parallel to the MOS transistor 61. The analog output signal Vout is supplied to a gate electrode G of the MOS transistor 62.

An analog switch device in FIG. 18 is the same as that in FIG. 16 except that the drain electrode D of the MOS transistor 61 is connected to a point at a constant voltage VE, instead of being connected to the point to which the clock pulse φ is applied.

An analog switch device in FIG. 19 is the same as that in FIG. 16 except that the MOS transistor 61 is connected to the point to which the clock pulse φ is supplied through another n-channel MOS transistor 63 which is controlled by the clock pulse φ, instead of being directly connected to the point to which the clock pulse φ is supplied.

An analog switch device in FIG. 20 is the same as that in FIG. 19 except that the drain electrode D of the n-channel MOS transistor 63 is connected to the constant voltage VE.

In an analog switch device in FIG. 21, the drain electrode D of the MOS transistor 61 is connected to the constant voltage VE through an n-channel MOS transistor 64 which is controlled by the analog output signal Vout.

Figure 22:
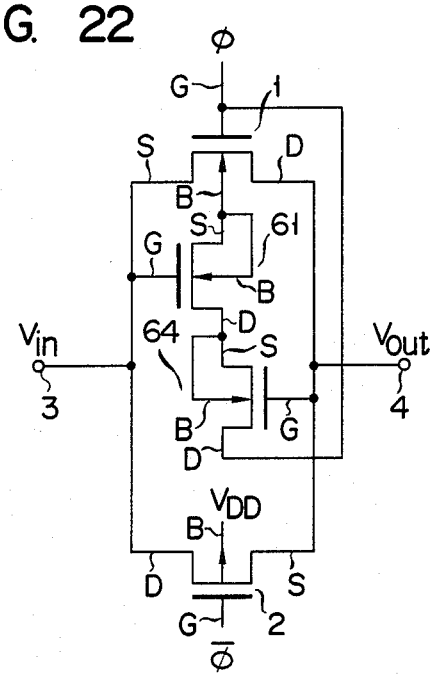

In an analog switch device in FIG. 22, the drain electrode D of the MOS transistor 64 shown in FIG. 20 is connected to the point to which the clock pulse φ is supplied.

Figure 23:
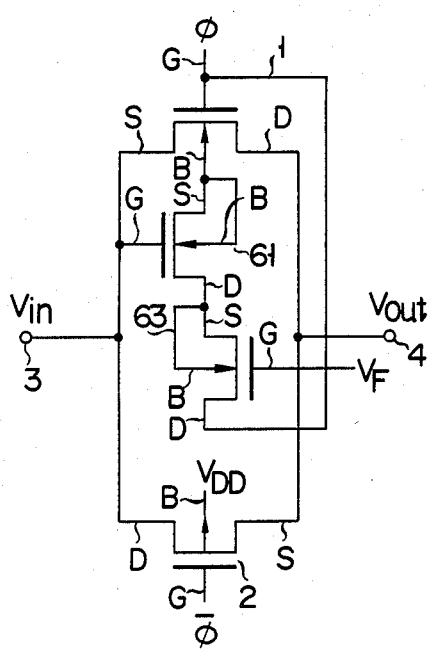

In an analog switch device in FIG. 23, a constant voltage VF is applied to the gate electrode G of the MOS transistor 63 shown in FIG. 19. The MOS transistor 63 serves as a resistance element having a predetermined ON resistance.

Figure 24:
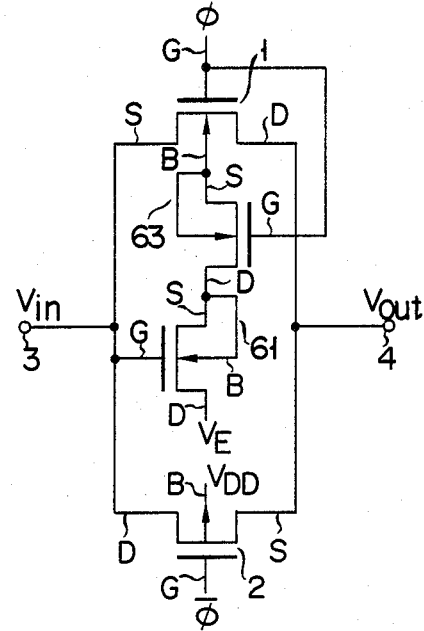

In an analog switch device in FIG. 24, the MOS transistors 61 and 63 shown in FIG. 20 are reversed in order.

In the analog switch devices shown in FIGS. 17 to 24, two MOS transistors are arranged between the substrate electrode B of the MOS transistor 1 and a point at a predetermined voltage. One of the two MOS transistors receives the analog input signal Vin or the analog output signal Vout at its gate electrode G, so that a voltage substantially corresponding to the analog input Vin or the output Vout signal is applied to the substrate electrode B of the MOS transistor 1. Therefore, the analog switch devices described above have the same effects as shown in FIG. 5 and the distortion of the analog output signal Vout is very small.

In the analog switch devices shown in FIGS. 17, 21 and 22, a predetermined voltage is applied to the substrate electrode B of the MOS transistor 1 through the MOS transistor, the gate electrode of which receives the analog output signal Vout. Therefore, a voltage lower than the voltage corresponding to the analog output signal Vout is applied to the substrate electrode B of the MOS transistor 1, and the parasitic diode is more constantly reverse biased.

In the analog switch devices shown in FIGS. 18, 20, 21, 23 and 24, the parasitic diode can be constantly reverse biased by determining the voltage VE or VF to a predetermined value.

In the analog switch device shown in FIG. 19, the parasitic diode is constantly reverse biased by determining the threshold voltages of the MOS transistors 61 and 63 to predetermined values, respectively.

The p-type source region and the n-type drain region have been defined assuming Vin≦Vout. However, if Vin>Vout, the source and the drain region are reversed in correspondence with input and output ends. The same effects with reference to FIGS. 1 to 24 can be obtained when the analog switch is rendered conductive.

An analog switch device according to the sixth embodiment of the present invention will be described with reference to FIG. 25.

An n-channel MOS transistor 71 is arranged between the input end 3 and the substrate electrode B of the MOS transistor 1. A source electrode S of the MOS transistor 71 is connected to the substrate electrode B of the MOS transistor 1. A drain electrode D of the MOS transistor 71 is connected to the input end 3, and a gate electrode G thereof is connected to the output end 4. The substrate electrode B of the MOS transistor 71 is connected to the source electrode S thereof. In the sixth embodiment, a case is described in which Vin≧Vout. The source electrodes S and the drain electrodes D of the MOS transistors 1 and 2 are reversed to those of the foregoing embodiments.

In the analog switch device with the above arrangement, if the clock pulse φ is set to L level and the clock pulse φ̄ is set to H level, the n-channel MOS transistor 1 and the p-channel MOS transistor 2 are both OFF. The resistances RN and RP are greatly increased. As a result, the analog input signal Vin is not transmitted to the output end 4.

However, if the clock pulse φ is set to H level and the clock pulse φ̄ is set to L level, the MOS transistors 1 and 2 are both ON. The analog input signal Vin is transmitted to the output end 4 through the MOS transistors 1 and 2. The analog input signal Vin is also applied to the drain electrode D of the n-channel MOS transistor 71, and the gate electrode G thereof receives the analog output signal Vout. If Vin≧Vout−Vth71 (where Vth71 is the threshold voltage of the MOS transistor 71), the MOS transistor 71 is saturated, and the voltage of the source electrode thereof is Vout−Vth71. However, if Vin<Vout−Vth71, the MOS transistor 71 is not saturated, and the source electrode S thereof is set at Vin. Therefore, a voltage applied to the substrate electrode B of the MOS transistor 1 is Vout−Vth71 or Vin. If Vin≧Vout−Vth71, the source-substrate bias voltage VBS of the MOS transistor 1 is Vth71. However, if Vin<Vout−Vth71, the source-substrate bias voltage VBS of the MOS transistor 1 is Vin−Vout (≅0 V). As a result, the source-substrate bias voltage VBS of the MOS transistor 1 is constantly below Vth71. Since Vth71 is very small, a change in the ON resistance RON of the MOS transistor 1 due to a change in the threshold voltage is substantially eliminated.

The characteristics of the resistances RN, RP and RON of the analog switch device of the sixth embodiment are the same as those shown in FIG. 5.

The analog input signal Vin is applied to the drain electrode D of the MOS transistor 71, and the analog output signal Vout is applied to the gate electrode G thereof. Thus, at most, a voltage lower than the voltage corresponding to the analog output signal Vin by the threshold voltage Vth71 of the MOS transistor 71 is applied to the source electrode S of the MOS transistor 71. Therefore, the parasitic diode formed in the p-type well region is constantly reverse biased.

Figure 25:
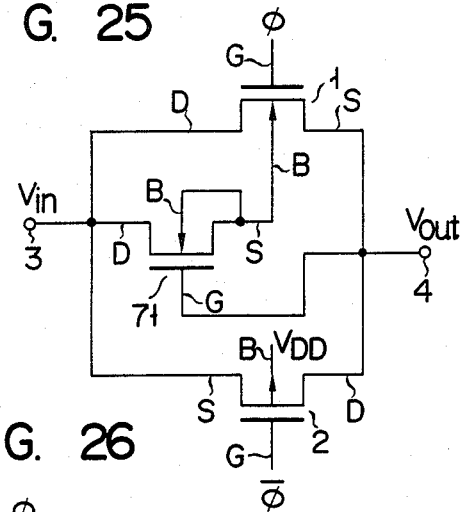
FIG. 25 is a circuit diagram of an analog switch device according to the sixth embodiment of the present invention.
Figure 26:
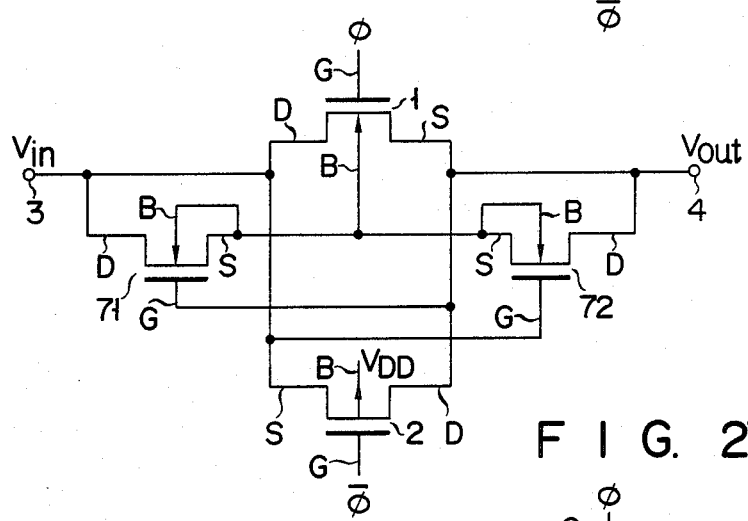
FIG. 26 is a circuit diagram of a modification of the analog switch device shown in FIG. 25.

FIG. 26 is a modification of the analog switch device shown in FIG. 25. This analog switch further has another enhancement-type n-channel MOS transistor 72. Source, drain and gate electrodes S, D and G of the MOS transistor 72 are connected to the substrate electrode B of the MOS transistor 1, the output end 4 and the input end 3, respectively. A substrate electrode B of the MOS transistor 72 is connected to the source electrode S thereof.

Figure 27:
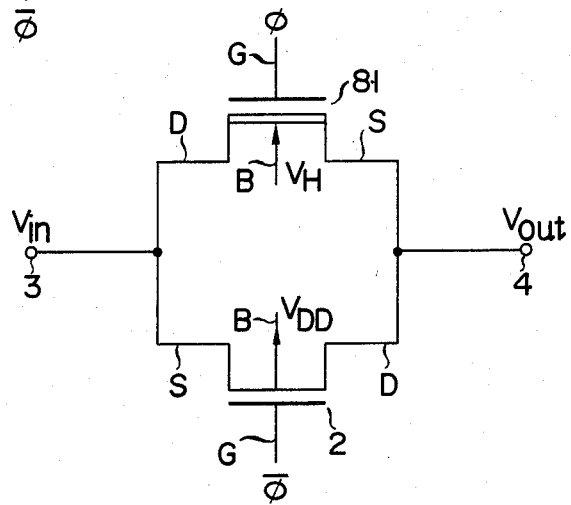
FIG. 27 is a circuit diagram of an analog switch device according to the seventh embodiment of the present invention.

An analog switch device according to the seventh embodiment of the present invention will be described with reference to FIG. 27.

The following proportional expression is given for an ON resistance R of the MOS transistor.

$$R \propto 1/(VGS - Vth) \qquad (3)$$

where VGS is the voltage between the gate and source electrodes and Vth is the threshold voltage.

Further, the threshold voltage Vth of the MOS transistor is given by the following equation:

$$Vth = Vth0 + tox/\epsilon ox \cdot \sqrt{2q\epsilon_s N} \cdot (\sqrt{2\phi F + VBS} - \sqrt{2\phi F}) \qquad (4)$$

where Vth0 is the intrinsic threshold voltage (when the potential difference between the source and substrate electrodes is zero); tox is the thickness of the gate insulating film; $\epsilon ox$ is the permittivity of the gate insulating film; $\epsilon_s$ is the permittivity of silicon; q is an electric charge of electron; N is the impurity concentration of the substrate; VBS is the voltage between the source and substrate electrodes; and $\phi F$ is the Fermi level.

If the source-substrate bias voltage VBS is increased in equation (4), the threshold voltage Vth is also increased. According to expression (3), the resistance R is also increased.

A change $\Delta$Vth in the threshold voltage Vth with changes in the source-substrate bias voltage VBS in equation (4) is defined by the following equations:

$$\Delta Vth = tox/\epsilon ox \cdot \sqrt{2q\epsilon_s N} \cdot (\sqrt{2\phi F + VBS} - \sqrt{2\phi F}) \qquad (5)$$

$$\partial \Delta Vth/\partial VBS = tox/\epsilon ox \cdot \sqrt{2q\epsilon_s N} \cdot (\tfrac{1}{2}\sqrt{2\phi F + VBS}) \qquad (6)$$

If the voltage VBS is very high in equation (6), the change $\Delta$Vth is small. The analog switch device according to the seventh embodiment is based on the above calculation results.

The analog switch device comprises a depletion type n-channel MOS transistor 81 and the enhancement-type p-channel MOS transistor 2. A voltage (negative voltage) VH lower than the minimum voltage of the analog input signal Vin is applied to the substrate electrode B of the MOS transistor 81. The MOS transistor 81 is formed in the p-type well region formed in the n-type semiconductor substrate.

A threshold voltage Vth81 of the MOS transistor 81 changes from a negative value to a positive value by the voltage VH applied to the substrate electrode B. Even if the clock pulse $\phi$ is set to L level and the clock pulse $\bar{\phi}$ is set to H level, the MOS transistor 81 is OFF. Further, since the p-channel MOS transistor 2 is also OFF, the analog input singal Vin cannot be transmitted to the output end 4.

Assume now that the clock pulse $\phi$ is set to H level and the clock pulse $\bar{\phi}$ is set to L level. A negative voltage VH is applied to the substrate electrode B of the MOS transistor 81 which is highly affected by the source-substrate bias effect due to a change in the analog input signal Vin. The MOS transistor 81 is operated under the condition that the source-substrate bias voltage is high. The change $\Delta$Vth with changes in the analog input signal Vin is small. Thus, the influence of the ON resistance due to a change in the threshold voltage is minimized. If the intrinsic threshold voltage of the MOS transistor 81 is set at $-2.5$ V, the intrinsic threshold voltage of the MOS transistor 2 is set at $-1.0$ V, and the voltage VH applied to the substrate electrode B of the MOS transistor 81 is set at $-5$ V, the same resistance characteristics as indicated by the solid line in FIG. 5 are obtained. The distortion of the analog output signal Vout is very small.

In the analog switch device of the seventh embodiment, since the negative voltage exceeding the source-substrate bias voltage generated by the analog input signal Vin is applied to the substrate electrode B of the MOS transistor 81, the parasitic diode formed between the substrate and drain regions of the MOS transistor 81 is reverse biased.

The MOS transistor 81 of the analog switch device of the seventh embodiment need not be limited to be of the depletion type but may also be of the enhancement type.

The analog switch device as described above comprises CMOS transistors formed in the semiconductor substrate and the well region formed therein. However, the present invention may be applied to an analog switch device comprising p- and n-channel MOS transistors formed on sapphire. In this case, the substrate regions of the p- and n-channel MOS transistors can have the same impurity concentration. Therefore, the sensitivity difference is not caused between the p- and n-channel MOS transistors, unlike in a CMOS analog switch device. However, if a predetermined voltage is applied to the substrate regions of the p- and n-channel MOS transistors, respectively, using the means according to the present invention, the sensitivity difference between the p- and n-channel MOS transistors can be minimized. As a result, the ON resistance RON of the analog switch device does not substantially depend upon the analog input signal Vin.

What we claim is:

1. An analog switch device for receiving a first analog signal and producing a second analog signal corresponding thereto in response to complementary control signals, the device comprising:

p- and n-channel metal oxide semiconductor (MOS) field effect transistors, each having a source electrode, a drain electrode, a gate electrode and a substrate electrode, said p- and n-channel metal oxide semiconductor field effect transistors being connected in parallel with each other to define a pair of nodes for receiving and producing the first and second analog signals, and said gate electrodes of said p- and n-channel metal oxide semiconductor field effect transistors receiving the complementary control signals; and means for applying a predetermined voltage to said substrate electrode of one of said p- and n-channel metal oxide semiconductor field effect transistors to reduce changes in a threshold voltage due to a source-substrate bias effect, said predetermined voltage depending upon at least one of said first and second analog signals, said voltage applying means including a first MOS transistor of an enhancement type having the same conductivity type as that of said metal oxide semiconductor field effect transistor whose substrate electrode receives said predetermined voltage, with one of said first and second analog signals being applied to a gate electrode of said first MOS transistor, one end of a source-drain path of said first MOS transistor being connected to first voltage supply means, and the other end of said source-drain path being connected to said substrate electrode for supplying said predetermined voltage to said substrate electrode.

2. A device according to claim 1, further comprising resistor means connected between the other end of the source-drain path of said first MOS transistor and second voltage supply means.

3. A device according to claim 2, wherein said resistor means comprises a second MOS transistor of a depletion type having a conductivity type opposite to the conductivity type of said metal oxide semiconductor field effect transistor whose substrate electrode receives said predetermined voltage, said second MOS transistor having a source-drain path connected in series to the source-drain path of said first MOS transistor, and one of said first and second analog signaas being applied to a gate electrode of said second MOS transistor.

4. A device according to claim 2, wherein said resistor means comprises a second MOS transistor whose gate electrode receives a constant voltage.

5. A device according to any one of claims 1 to 4, wherein said first MOS transistor is connected to said first voltage supply means through a source-drain path of a third MOS transistor, said third MOS transistor having a gate electrode which receives the other of said first and second analog signals which is not applied to said gate electrode of said first MOS transistor.

6. A device according to any one of claims 1 to 4, wherein a fourth MOS transistor is connected in series with said first MOS transistor, said fourth MOS transistor having a gate electrode applied with one of said complementary control signals for turning on said fourth MOS transistor when said p- and n-channel metal oxide semiconductor field effect transistors are on.

7. A device according to any one of claims 1 to 4, wherein said first MOS transistor has a threshold voltage for continuously reverse biasing a junction formed between said substrate region and said source and drain regions of said metal oxide semiconductor field effect transistor whose substrate electrode receives said predetermined voltage.

* * * * *

UNITED STATES PATENT AND TRADEMARK OFFICE
CERTIFICATE OF CORRECTION

PATENT NO. :    4,529,897
DATED      :    July 16, 1985
INVENTOR(S) :   Yasoji Suzuki et al.

It is certified that error appears in the above-identified patent and that said Letters Patent is hereby corrected as shown below:

Claim 3, line 9, change "signaas" to --signals--.

Signed and Sealed this

Thirteenth Day of May 1986

[SEAL]

Attest:

DONALD J. QUIGG

Attesting Officer

Commissioner of Patents and Trademarks